United States Patent [19]

Bollen et al.

[11] Patent Number: 5,105,234

[45] Date of Patent: Apr. 14, 1992

[54] ELECTROLUMINESCENT DIODE HAVING A LOW CAPACITANCE

[75] Inventors: Lambertus J. M. Bollen; Edward W. A. Young, both of Eindhoven, Netherlands

[73] Assignee: U.S. Philips Corporation, New York, N.Y.

[21] Appl. No.: 651,032

[22] Filed: Jan. 28, 1991

Related U.S. Application Data

[63] Continuation of Ser. No. 439,716, Nov. 20, 1989, abandoned.

[30] Foreign Application Priority Data

Nov. 29, 1988 [NL] Netherlands ............. 8802936

[51] Int. Cl.$^5$ .................................... H01L 33/00
[52] U.S. Cl. .......................... 357/17; 357/16; 357/30; 372/45
[58] Field of Search ............ 357/16, 17, 56, 30 B, 357/30 D, 30 E, 30 L, 30 P, 30 Q, 30 R, 4; 372/43, 44, 45

[56] References Cited

U.S. PATENT DOCUMENTS

4,340,967  7/1982  Dixon et al. .................. 357/17

FOREIGN PATENT DOCUMENTS

| 0161016 | 11/1985 | European Pat. Off. | 357/17 |
| 57-143888 | 9/1982 | Japan | 357/17 |
| 0004278 | 1/1985 | Japan | 357/17 |
| 0153185 | 8/1985 | Japan | 357/17 |
| 0189280 | 9/1985 | Japan | 372/43 |
| 0054990 | 3/1987 | Japan | 372/43 |
| 0175492 | 7/1988 | Japan | 372/43 |
| 0252496 | 10/1988 | Japan | 372/43 |

*Primary Examiner*—Rolf Hille
*Assistant Examiner*—Minhloan Tran
*Attorney, Agent, or Firm*—Steven R. Biren

[57] ABSTRACT

A semiconductor device has a pn junction for producing electromagnetic radation in an active region and a monocrystalline semiconductor body having a first region of a first conductivity type and a second region of the second opposite conductivity type, which forms with each other the pn junction. On the second region is disposed a blocking layer of the first conductivity type, which has an interruption at the area of the active region, while on the blocking layer is disposed a highly doped contact layer of the second conductivity type, which adjoins a surface and in which a contact region is located at the area of said interruption, which also adjoins the surface and extends into the second region. The first region on the one hand and the contact region and the contact layer on the other hand are each provided with an electrode. A high-ohmic region having a disturbed crystal structure, which is located at a certain distance from the contact region and is obtained by ion bombardment, is located in the semiconductor body and extends from the surface at least through the contact layer and the blocking layer. As a result, the advantage of the presence of a contact layer is maintained, while the disadvantage, i.e. a high capacitance due to the layer, is obviated.

8 Claims, 2 Drawing Sheets

ELECTROLUMINESCENT DIODE HAVING A LOW CAPACITANCE

This is a continuation of application Ser. No. 439,716, filed Nov. 20, 1989, now abandoned.

BACKGROUND OF THE INVENTION

The invention relates to a semiconductor device for producing electromagnetic radiation having a monocrystalline semiconductor body comprising a first region of a first conductivity type and a second region of the second opposite conductivity type forming with the first region a pn junction which can emit electromagnetic radiation at a sufficiently high current strength in the forward direction, while on the second region a blocking layer of the first conductivity type is provided, which has an interruption at the area of an active region of the device, a contract region of the second conductivity type which adjoins a surface of the body and extends at the area of said interruption from the surface into the second region, and a highly doped contact layer of the second conductivity type which is disposed on the blocking layer, also adjoins the surface and is connected to the contact region, a first electrode being provided on the first region and a second electrode being provided on the contact region and the contact layer.

Such a semiconductor device is known from the Japanese Patent Application (Kokai) JP-A 57-143888 laid open to public inspection and published in Patent Abstracts of Japan, vol. 6, Dec. 2, 1982, No. 243 (E-145) p. 144.

In optical telecommunication, electroluminescent diodes are frequently used. These diodes may be composed of different semiconductor materials, such as binary, ternary and quaternary compounds of elements from the columns III and V of the Periodical System, in accordance with the wavelength of the emitted radiation chosen for the relevant application and other optical and electrical properties.

The generated electromagnetic radiation may then be coherent (lasers) or incoherent. The radiation may emanate either through a major surface ("surface-emitting") or at the edge of the semiconductor body ("edge emitting").

For applications in the field of optical telecommunication, a luminous spot of small dimensions and high brightness is generally desired, for which purpose a high current density must be concentrated on a small active region. For this purposes, different methods may be used. A frequently used method consists in providing a blocking layer of a conductivity type opposite to that of the surrounding semiconductor material, this blocking layer locally having an interruption through which the current can flow, while it is blocked elsewhere by the pn junctions between the blocking layer and the adjoining material.

Thus, in a known type of electroluminescent diode (LED), a blocking layer of the first conductivity type is provided on the said second region of the semiconductor body, after which the area of the interruption in the blocking layer a contact region of the first conductivity type contacts via said interruption the second region. The whole current then flows through said contact region and the active electroluminescent part is limited to practically the dimensions of said interruption.

Such a diode may have a small radiation-emanating surface of high radiation intensity and is very suitable as such to be used in the field of optical telecommunication. However, it has been found in practice that due to the high current density even with a very low electrical resistance of the contact region the voltage drop across the diode is still comparatively high, which results in a higher dissipation, which gives rise not only to higher electrical losses, but also to a more rapid aging of the crystals.

In order to reduce the contact resistance, as described in JP-A 57-143888, further a highly doped contact layer of the second conductivity type is provided on the blocking layer and this contact layer adjoins the contact region. Due to the resulting reduction of the contact resistance, a considerably lower voltage drop across the diode is attained.

This structure operates satisfactorily as long as the dimensions of the crystal are not too large, for example not larger than about 300×300 $\mu m^2$.

However, with larger dimensions, problems arise at high modulation frequencies (higher than, for example, 100 MHz) due to the capacitance caused by the contact layer. In optical telecommunication, higher frequencies are often employed, for which these LED's do not operate sufficiently rapidly.

SUMMARY OF THE INVENTION

The invention has inter alia for its object to provide a LED structure in which the said problem is avoided or is reduced at least to a considerable extent without the advantages obtained by the presence of the contact layer being eliminated.

According to the invention, a semiconductor device of the kind described above is characterized in that a high-ohmic or resistive region having a disturbed crystal structure located at a certain distance from the contact region and obtained by ion bombardment extends from the said surface at least through the contact layer and the blocking layer.

This solution in which a part of the contact layer obtains a very high resistance seems to conflict with the purpose for which this contact layer is provided.

However, it has been found that, when the high-ohmic region is provided at a certain distance from the contact region, it is possible to substantially maintain the advantages of the contact layer. This is presumably due to the fact that the resistance of the contact layer in the layer direction is determinative of the contribution of this layer to the series resistance of the diode and this contribution is influenced to a comparatively small extent by the parts of the contact layer farther remote from the contact region.

The distance between the contact region and the high-ohmic region should on the one hand not be too large in order that the capacitance-reducing effect of the high-ohmic regions appears to full advantage. However, on the other hand this distance must not be too small either because in this case the resistance-reducing function of the contact layer is lost. It has been found that the optimum result is obtained when the part of the surface not occupied by the high-ohmic region is larger than twice the surface of the contact region and smaller than 60,000 $\mu m^2$, while the distance between the contact region and the high-ohmic region is practically equal throughout the structure.

The high-ohmic region can be obtained by implantation of, for example, helium or deuterium ions. However, the high-ohmic region is preferably a region obtained by proton bombardment because this technique is well known, can be readily controlled and is moreover used also for other purposes in the laser and LED manufacture.

As already stated above, the problem for which the present invention provides a solution arises especially in semiconductor crystals which are not very small. The present invention is therefore used with advantage especially in devices in which the smallest dimension parallel to the surface is at least 300 μm.

The present invention is of particular importance for those electroluminescent diodes (lasers or LED's) used in the long-wave length range (1.30–1.55 μm) interesting for optical telecommunication and the specific layer structure used for this purpose.

An important preferred embodiment of a semiconductor device according to the invention is therefore characterized in that the semiconductor body is composed of a substrate of a first semiconductor material of the first conductivity type with a layer structure disposed thereon and comprising successively a buffer layer of the first semiconductor material and also of the first conductivity type, an active layer of a second semiconductor material, a cladding layer of the first semiconductor material of the second conductivity type, a blocking layer of the second semiconductor material of the first conductivity type and a contact layer of the second semiconductor material of the second conductivity type, and in that the high-ohmic region extends from the surface to a greater depth than the contact region.

The first semiconductor material is advantageously indium phosphide and the second semiconductor material may be of indium gallium arsenic phosphide.

The contact region in practice is mostly p-type conducting and can be obtained technologically in different ways. Preferably, the contact region is a region diffused with zinc (Zn) because zinc is in n-type III–V materials or mixed crystals thereof a suitable acceptor, both from an electrical and from a technological viewpoint.

The invention can be used advantageously both in edge-emitting and in surface-emitting lasers of LED's. The invention is of particular importance in semiconductor devices, in which the radiation emanates on the substrate side via a major surface of the substrate.

BRIEF DESCRIPTION OF THE DRAWINGS

The invention will now be described more fully with reference to an embodiment and the drawing, in which.

The Figures are schematic and not drawn to scale, while for the sake of clarity especially the dimensions in the direction of thickness are greatly exaggerated. Corresponding parts are generally provided with the same reference numerals.

DESCRIPTION OF THE PREFERRED EMBODIMENT

Figure 1:
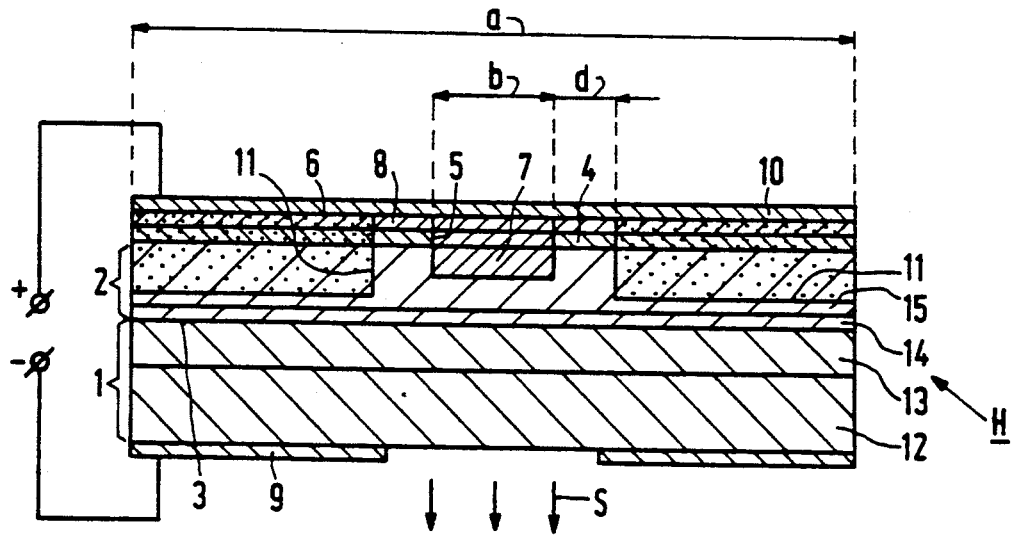
FIG. 1 shows a diagrammatically in cross-section a semiconductor device according to the invention.

FIG. 1 shows diagrammatically in cross-section a semiconductor device for producing electromagnetic radiation according to the invention. The device comprises a monocrystalline semiconductor body H, in this embodiment of square shape with sides a, having a first region 1 of the first conductivity type and a second region 2 of the second opposite conductivity type forming with the first region a pn junction 3, which can emit electromagnetic radiation S at a sufficiently high current intensity in the forward direction. In this embodiment, the first region consists of an n-type substrate 12 of indium phosphide (InP) and a buffer layer 13 disposed thereon also consisting of n-type indium phosphide, while the second region consists of a p-type active layer 14 of indium gallium arsenic phosphide (InGaAsP), and a cladding layer 15 disposed thereon consisting of p-type indium phosphide.

On the second region 2 is disposed a blocking layer 4 of indium phosphide of the first conductivity type, so in this case n, conductivity type, which has at the area of an active radiation-emitting region of the device an interruption, which is circular in this embodiment and whose edge is designated by reference numeral 5. Further a contact region 7 of the second, so p-, conductivity type, which adjoins a surface 6 of the body and extends at the area of the interruption 5 from the surface 6 into the second region 2.

Finally, on the blocking layer 4 is disposed a highly doped contact layer 8 of indium phosphide of the second, so p-, conductivity type, which also adjoins the surface 6 and is connected to the second p-type contact region 7. On the first region 1 is provided a first electrode 9 in the form of a metal layer and on the contact region 7 and the contact layer 8 is provided a second electrode 10, also in the form of a metal layer.

In the electroluminescent device described thus far, the radiation S emanates through a major surface of the substrate 12 through an aperture in the first electrode 9. With a correct dimensioning of the thicknesses and dopings of the various semiconductor layers, radiation of high intensity can be obtained on a small radiation-emitting surface. At high modulation frequencies (>100 MHz) of the device, however, problems arise due to the capacitance caused by the comparatively large surface of the contact layer 8.

In order to prevent this disadvantage, according to the invention (cf. FIG. 1), a high-ohmic region 11 having a disturbed crystal structure is provided, which is located at a distance d from the contact region 7, is obtained by ion bombardment and extends from the surface 6 at least through the contact layer 8 and the blocking layer 4.

Due to the last-mentioned measure, the LED according to the invention can be used up to considerably higher modulation frequencies than an otherwise identical diode, in which the high-ohmic region 11 is omitted.

Figure 2:
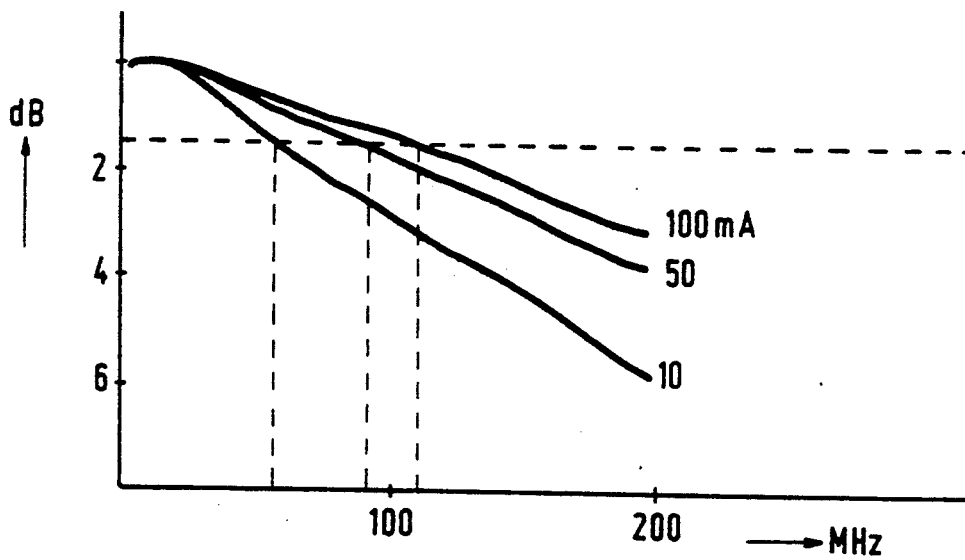
FIGS. 2 and 3 show measurement results for a known diode and a diode according to the invention.
Figure 3:
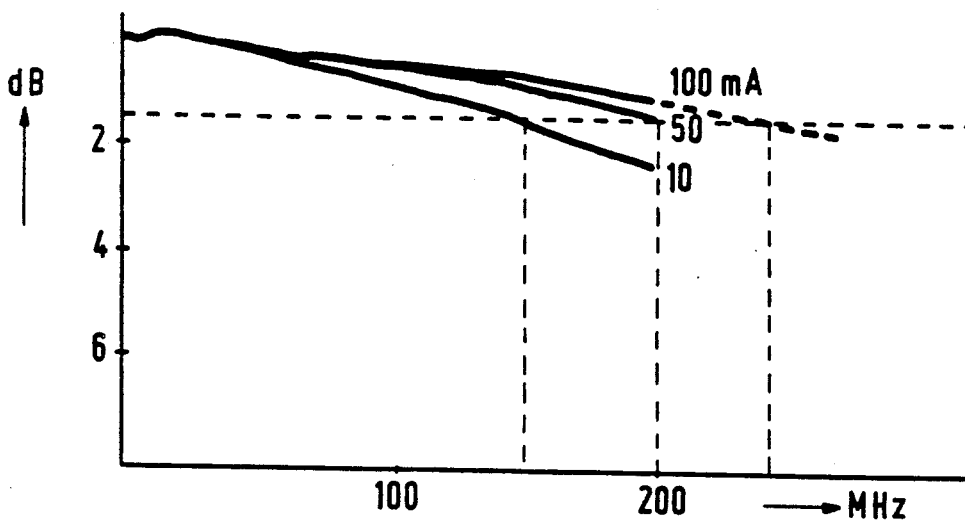

This appears from measurements, of which the results are shown in FIGS. 2 and 3. FIG. 2 shows the so-called Bode diagram of the light-emitting diode of FIG. 1 without the high-ohmic region 11 and FIG. 3 shows that of the diode of FIG. 1. In these Bode diagrams, the attenuation of the optical power in dB is plotted on the ordinate and the modulation frequency is plotted on the abscissa for three different values of the pumping current. It clearly appears that with the same pumping current the diode according to the invention can be used up to frequencies lying approximately a factor 2 higher than in the diode according to the prior art.

In the diode of this embodiment, the semiconductor crystal has a square shape with sides a of about 500 μm. The diameter b of the contact region 7 is 25 μm and consequently its surface area is $0.25 \times 3.14 \times 625 = 491$ μm². The distance d between the contact region 7 and the high-ohmic region 11 is throughout the structure 7.5 μm and the part of the surface not occupied by the high-ohmic region 11 is consequently $0.25 \times 3.14 \times 1600 = 1256$ μm². The wavelength of the emitted radiation is 1300 nm and the dimensioning of the various semiconductor layers is as indicated in the following table.

| Layer | Material | x | y | Type | Doping cm$^{-3}$ | Thickness μm |
|---|---|---|---|---|---|---|
| 12 | InP | | | N | $3.10^{18}$ S | 100 |
| 13 | InP | | | N | $2.10^{18}$ Sn | 4 |
| 14 | In$_x$Ga$_{1-x}$As$_y$P$_{1-y}$ | 0,74 | 0,61 | P | $8.10^{18}$ Zn | 0,8 |
| 15 | InP | | | P | $10^{18}$ Zn | 1,5 |
| 4 | In$_x$Ga$_{1-x}$As$_y$P$_{1-x}$ | 0,90 | 0,23 | N | $8.10^{17}$ Sn | 0,6 |
| 8 | In$_x$Ga$_{1-x}$As$_y$P$_{1-y}$ | 0,80 | 0,43 | P+ | $5.10^{18}$ Zn | 0,3 |

As appears from FIGS. 2 and 3, in the absence of the high-ohmic region 11 the band gap of the diode (defined as the point at which the optical output modulation is attenuated by 1.5 dB), is limited to about 110 MHz (at 100 mA). In the diode according to the invention, however, due to the presence of the region 11 and the reduction in capacitance caused thereby, the band width is practically doubled.

The diode described can be manufactured with the use of conventional techniques.

The starting material is a substrate 12 of indium phosphide, on which with the use of known epitaxial growing processes the layer structure indicated in the table is grown, for example by means of growth from the liquid phase, known under the designation "liquid phase epitaxy" (LPE), although other epitaxial techniques or mixed forms thereof may also be used.

Figure 4:
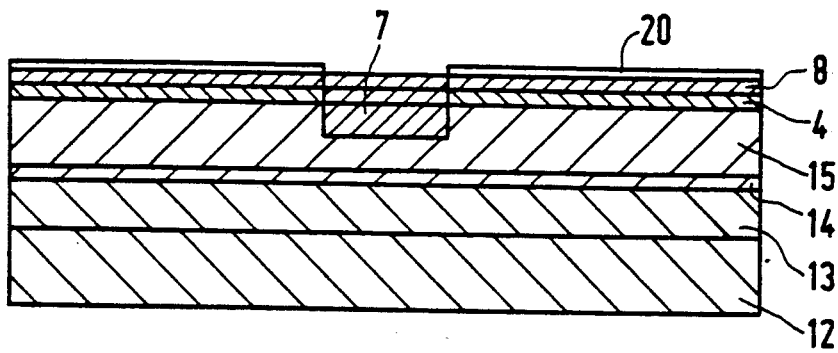
FIGS. 4 to 6 show diagrammatically in cross-section the device of FIG. 1 at successive stages of manufacture.

Subsequently (cf. FIG. 4) on the surface of the layer 8 is deposited a layer 20 of silicon oxide having a thickness of, for example, about 0.15 μm from the gaseous phase and a circular window having a diameter of 25 μm is etched therein. By diffusion of zinc, for example from the gaseous phase, the contact region 7 (depth about 2 μm) is diffused therein, the oxide 20 masking against this diffusion. For the sake of simplicity, the lateral diffusion is neglected in the drawing. By redoping of the n-type layer, the aforementioned interruption is obtained.

Figure 5:
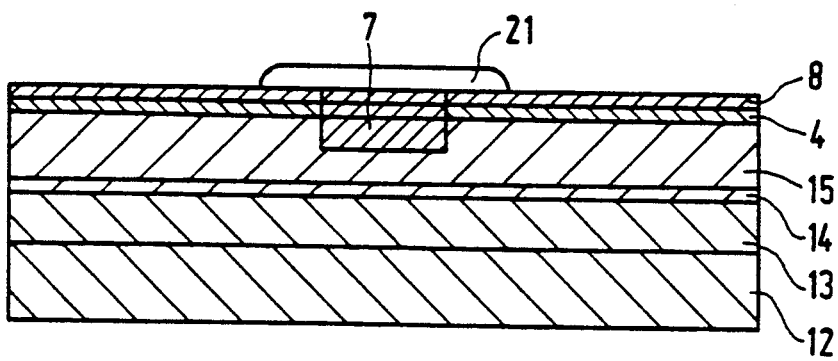

Subsequently, the oxide 20 is etched away and the surface 6 of the layer 8 is covered with a circular mask 21 of gold having a diameter of 40 μm (cf. FIG. 5), the center of which coincides with that of the contact region 7.

Figure 6:
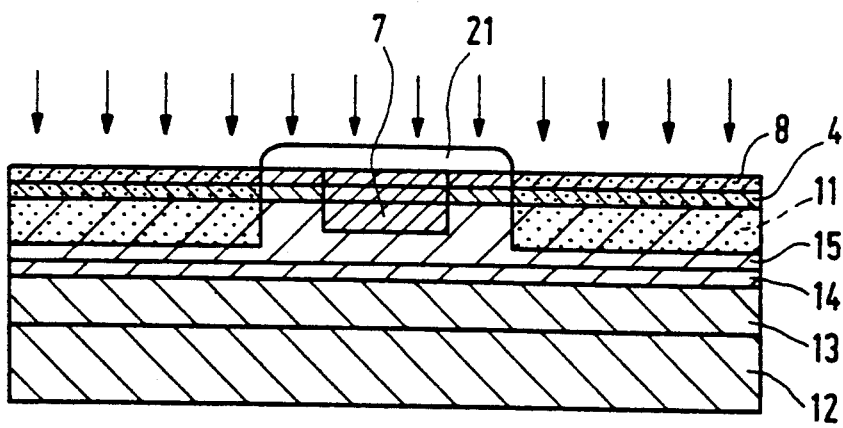

A proton bombardment is then carried out on the surface 6 in order to form a high-ohmic region having a disturbed crystal structure (cf. FIG. 6). In this embodiment, proton bombardments at energies of 320, 200 and 100 keV and doses of $10^{15}$, $6.10^{14}$ and $2.10^{14}$ protons per cm², respectively, were carried out successively. In these circumstances, a high-ohmic region 11 having a disturbed crystal structure was formed having a depth of 2.5 μm.

Subsequently, the electrode layer 10 indicated in FIG. 1 (in this emboidment of platinum) and the electrode layer 9 (in this embodiment of AuGeNi), as the case may be reinforced with a gold layer applied by electro-deposition, are applied also by the use of known methods. An opening is then provided in the layer 9 at the area of the active region, i.e. under the interruption in the blocking layer 4. In this embodiment, the layer 9 therefore forms an annular contact. Subsequently, the diode can be finished in the desired manner.

The diodes thus obtained have a high reliability and stability. Due to the large surface of the electrode layer 10, the contact resistance is comparatively low and high performance is obtained even with a high current strength, such as 100 mA. Due to the fact that the definition of the luminous spot is realized internally in the crystal (by means of the blocking layer 4) and is not realized by means of externally provided oxide layers or other isolation layers, mechanical stresses are avoided, which results in a long life.

Figure 7:
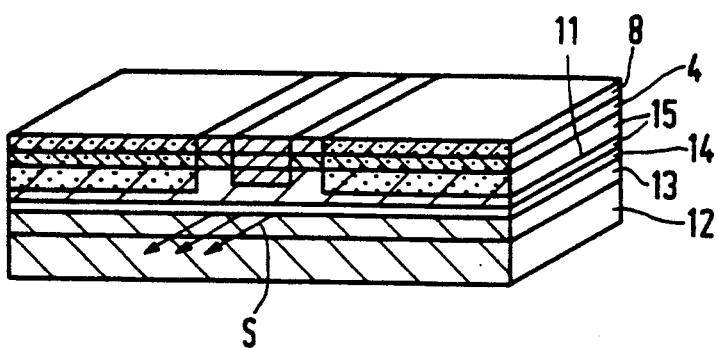
FIG. 7 is a perspective view of another device according to the invention.

Although in this embodiment an electroluminescent diode is described which emits incoherent radiation via a major surface of the crystal, the invention is not limited thereto. The invention may also be advantageously used in the manufacture of diodes in which the radiation S emanates through an edge surface; the active region is then preferably strip-shaped (cf. FIG. 7, in which for the sake of clarity the electrode layers are omitted). When the edge surface at which the radiation emanates and the edge surface located opposite thereto are made at least partly reflecting or when the active region of the layer 14 is enclosed in a different manner in a resonant cavity, for example as in lasers of the DFB and DBR type, coherent radiation may also be produced.

The invention is further not limited to the semiconductor materials mentioned in the embodiment, but may be advantageously used in all the diodes of the indicated type, irrespective of the wavelength of the emitted radiation and the semiconductor materials employed. More particularly, it should be noted that the active layer 14 may also be n-type doped instead of the p-type doped, in which event the pn junction 3 is located between the layers 14 and 15 instead of between the layers 14 and 13.

We claim:

1. A semiconductor device for producing electromagnetic radiation and having a monocrystalline semiconductor body comprising a first region of a first conductivity type and a second region of the second opposite conductivity type forming with the first region a pn junction which emits electromagnetic radiation at a selected current strength in a forward direction, a blocking layer of the first conductivity type on the second region and having an area of an active region of the device, a contact region of the second conductivity type, which adjoins a surface of the body and extends at the area of said interruption from the surface into the second region, and a conductive contact layer of the second conductivity type, which is disposed on the blocking layer, adjoins the surface and is connected to the contact region, a first electrode provided on the first region and a second electrode being provided on the contact region and the contact layer, characterized in that a resistive region having a disturbed crystal structure, which is located at a distance from the contact region and is obtained by ion bombardment, extends from said surface at least through the contact layer and the blocking layer.

2. A semiconductor device as claimed in claim 1, characterized in that the part of the surface not occupied by the resistive region is larger than twice the surface of the contact region and is smaller than 60,000 $\mu m^2$, while the distance between the contact region and the resistive region is substantially equal throughout the structure.

3. A semiconductor device as claimed in claim 1, characterized in that the resistive region is a proton-bombarded region.

4. A semiconductor device as claimed in claim 1, characterized in that a smallest dimension of the semiconductor body parallel to the surface is at least 300 $\mu m$.

5. A semiconductor device as claimed in claim 1, characterized in that the semiconductor body is composed of a substrate of a first semiconductor material of the first conductivity type with a layer structure disposed thereon and comprising subsequently a buffer layer of the first semiconductor material of the first conductivity type, an active layer of a second semiconductor material, a cladding layer of the first semiconductor material of the second conductivity type, a blocking layer of the second semiconductor material of the first conductivity type and a contact layer of the second semiconductor material of the second conductivity type, and in that the resistive region extends from the surface to a greater depth than the contact region.

6. A semiconductor device as claimed in claim 5, characterized in that the first semiconductor material is indium phosphide (InP) and the second semiconductor material is indium gallium arsenic phosphide (InGaAsP).

7. A semiconductor device as claimed in claim 5, characterized in that the contact region is a region diffused with zinc.

8. A semiconductor device as claimed in claim 1, characterized in that radiation emanates on a substrate side via a major surface of the substrate.

* * * * *